United States Patent [19]

Yoda et al.

[11] Patent Number: 5,411,836
[45] Date of Patent: May 2, 1995

[54] POSITIVE TYPE PHOTORESIST COMPOSITION COMPRISING A POLYMER HAVING CARBON-CARBON DOUBLE BONDS WITH A MALEIC HALF ESTER AND A MALEIMIDE ATTACHED TO THE BACKBONE

[75] Inventors: Eiji Yoda, Yokohama; Haruyoshi Sato, Kawasaki; Yukio Yamasita, Yokohama; Hitoshi Yuasa, Yokohama; Yutaka Otsuki, Yokohama, all of Japan

[73] Assignee: Nippon Oil Co., Ltd., Tokyo, Japan

[21] Appl. No.: 742,622

[22] Filed: Aug. 8, 1991

[30] Foreign Application Priority Data

Aug. 14, 1990 [JP] Japan .................. 2-213731

[51] Int. Cl.⁶ .............. G03F 7/021; G03F 7/30
[52] U.S. Cl. .................. 430/190; 430/165; 430/191; 430/192; 430/193; 525/285
[58] Field of Search .............. 430/192, 193, 165, 190, 430/910, 907; 525/65, 285; 204/181.1, 181.2, 181.3, 181.6, 181.7

[56] References Cited

U.S. PATENT DOCUMENTS

| | | | |
|---|---|---|---|
| 3,905,820 | 9/1975 | Frass | 430/910 |
| 4,023,973 | 5/1977 | Imaizumi et al. | 430/910 |
| 4,072,536 | 2/1978 | Otsuki et al. | 525/285 |
| 4,138,377 | 2/1979 | Otsuki et al. | 524/499 |
| 4,275,142 | 6/1981 | Hosaka et al. | 430/286 |
| 4,642,325 | 2/1987 | Otsuki et al. | 525/65 |
| 4,710,446 | 12/1987 | Hoffmann et al. | 430/910 |
| 4,857,435 | 8/1989 | Hopf et al. | 430/192 |
| 4,889,787 | 12/1989 | Musser | 430/192 |
| 4,898,656 | 2/1990 | Hoshino et al. | 204/181.1 |
| 4,968,399 | 11/1990 | Tsuchiya et al. | 204/181.1 |
| 5,002,858 | 3/1991 | Demmer et al. | 430/190 |
| 5,055,374 | 10/1991 | Seto et al. | 430/190 |
| 5,080,998 | 1/1992 | Irving et al. | 430/190 |
| 5,106,718 | 4/1992 | Bartmann et al. | 430/192 |
| 5,171,656 | 12/1992 | Sebald et al. | 430/192 |
| 5,175,076 | 12/1992 | Ishikawa et al. | 430/910 |
| 5,212,043 | 5/1993 | Yamamoto et al. | 430/192 |

*Primary Examiner*—Charles L. Bowers, Jr.
*Assistant Examiner*—John S. Chu
*Attorney, Agent, or Firm*—Darby & Darby

[57] ABSTRACT

A positive type photoresist composition contains (a) 100 parts by weight of a resin which is a polymer compound (A) including carbon-carbon double bonds and having a molecular weight of 300 to 30,000 and an iodine value of to 500. To at least a part of the double bonds of the polymer compound (A), a group represented by the formula (I) is introduced

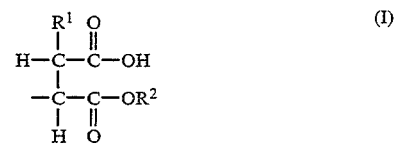

wherein $R^1$ denotes a hydrogen atom, a halogen atom or an alkyl group having 1 to 3 carbon atoms and $R^2$ denotes an alkyl group having 1 to 10 carbon atoms, a cycloalkyl group or an aryl group, The composition further contains (b) 25 to 100 parts by weight of a compound containing a quinone diazide unit.

18 Claims, No Drawings

POSITIVE TYPE PHOTORESIST COMPOSITION COMPRISING A POLYMER HAVING CARBON-CARBON DOUBLE BONDS WITH A MALEIC HALF ESTER AND A MALEIMIDE ATTACHED TO THE BACKBONE

BACKGROUND OF THE INVENTION

This invention relates to a positive type photoresist composition used for preparation of a printed circuit board or an integrated circuit. More particularly, it relates to a positive type photoresist composition which, when coated or electrodeposited on a board, forms a film exhibiting no tack at room temperature and excellent adhesive properties with respect to the board.

For keeping up with recent progress in electronic appliances, higher densification and integration as well as a finer circuit pattern are required of a printed circuit board as a carrier of an electronic circuit. For this reason, a surface packaging system is applied extensively for attaching electronic components to the board, in which there are formed increasing numbers of through-holes which play the role of electrical connection across the front and back sides of the board. By the through-holes are meant apertures the inside wall of which is plated with metal and which play the role of electrical connection across the front and back sides of the board and fixture of the electronic components on the board.

For preparing the printed circuit board having these through-holes and fine circuit patterns, it is necessary to protect the inner wall of the through-holes from the etching liquid.

However, with the method of laminating a photosensitive film known as a dry film employed extensively at present, it is difficult to laminate the metal surface uniformly. Moreover, since the film itself has a larger thickness of the order of 50 $\mu$m in general, and since the pattern of the etching resist produced upon exposure and development is not sharp, the through-holes with small diameters cannot be coated satisfactorily. Hence, with the laminating method, the fine circuit pattern cannot be realized.

On the other hand, with the method of uniformly applying an etching resist by electrodeposition, if a conventional negative type electrodeposition photoresist consisting mainly of a light curable resin is employed, the volume of light irradiated into the through-hole and hence the curing effect falls short, so that the electrically conductive layer of the inner wall of the through-hole can hardly be protected.

For obviating these shortcomings, researches are conducted at present for developing a positive type photoresist in which an exposed area is dissolved during development and an unexposed area functions as a protective layer, or a positive type electrodeposition photoresist capable of electrodeposition coating.

So long as the positive type photoresist is concerned, it has been proposed to use a quinone diazide compound and an alkaline solution as a photosensitive agent and as a developing solution, respectively. With the positive type photoresist, the area irradiated with light is rendered alkali-soluble so that the resist is dissolved and removed, while the area not irradiated with light is alkali-insoluble and hence is left without being removed. As a result, a protective layer may be formed without light irradiation on the inner wall of the through-hole which is hardly accessible to light.

It is noted that novolak or vinyl resins are currently employed as a resin which is a main component of the positive type photoresist employing the quinone diazide compound as the photosensitive agent. However, the novolak resin exhibits only poor adhesiveness to the board. On the other hand, the vinyl resin is unable to cause photomask adhesion because of tack in the coating film before and after irradiation, while exhibiting poor compatibility with the quinone diazide compound and poor stability of the electrodeposition liquid.

SUMMARY OF THE INVENTION

It is therefore a principal object of the present invention to provide a positive type photoresist composition which is free from tack of the coating film before and after light irradiation even at room temperature and which is excellent in adhesiveness with respect to the board and long-term stability of the electrodeposition bath to enable protection of the inner wall of the fine through-holes.

The above and other objects of the invention will become apparent from the following description.

In accordance with the present invention there is provided a positive type photoresist composition comprising (a) 100 parts by weight of a resin which is a polymer compound (A) including carbon-carbon double bonds and having a molecular weight of 300 to 30,000 and an iodine value of 50 to 500, to at least a part of the double bonds of the polymer compound (A) a group represented by the formula (I) being introduced

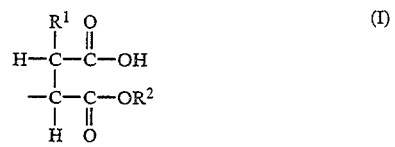

wherein $R^1$ denotes a hydrogen atom, a halogen atom or an alkyl group having 1 to 3 carbon atoms and $R^2$ denotes an alkyl group having 1 to 10 carbon atoms, a cycloalkyl group or an aryl group and (b) 25 to 100 parts by weight of a compound containing a quinone diazide unit.

In accordance with the present invention, there is also provided a positive type photoresist composition obtained upon neutralizing and dispersing or dissolving the above positive type photoresist composition in water.

PREFERRED EMBODIMENTS OF THE INVENTION

The present invention will be explained in more detail hereinbelow.

The component (a) of the positive type photoresist composition according to the present invention is a resin which is a particular polymer compound (A) to which a group represented by the formula (I) as later described is introduced.

The polymer compound (A) may be an organic polymer compound having a molecular weight ranging between 300 and 30,000 and preferably between 500 and 5,000 and an iodine value ranging between 50 and 500 and preferably between 100 and 470, and including carbon-carbon double bonds, wherein the amount of the double bonds situated in the main chain may preferably be 5 to 90 percent and more preferably 10 to 75 percent relative to the total amount of the double bonds and wherein the amount of the double bonds situated in the branched chain may preferably be 10 to 95 percent and more preferably 25 to 95% relative to the total amount of the double bonds. If the molecular weight of the polymer compound (A) exceeds 30,000, solubility of an irradiated area with respect to a developing liquid is lowered, whereas, if the molecular weight is lower than 300, the composition becomes unusable because of too low strength of a protective layer. On the other hand, if the iodine value of the polymer compound (A) is less than 50, desirable effect cannot be achieved because of an insufficient rate of introduction of the group represented by the formula (I) whereas, if the iodine value exceeds 500, desirable effect cannot be achieved because of poor storage stability. The high polymer compound (A) may be enumerated by natural lipids, such as linseed oil, tung oil, soybean oil or dehydrated castor oil, or so-called stand oil produced by heat-treating these natural lipids to increase their molecular weights, oligomers of conjugated diolefins, such as butadiene, isoprene or piperylene, low polymerization degree copolymers of one or more of these conjugated diolefins, and low polymerization degree copolymers of one or more of these conjugated diolefins and vinyl monomers having ethylenic unsaturated groups, namely aliphatic or aromatic vinyl monomers, such as isobutylene, diisobutylene, styrene, α-methylstyrene, vinyl toluene or divinylbenzene. These may be used alone or in combination.

According to the present invention, the group introduced into at least a portion of the double bonds of the polymer compound (A) is represented by the formula (I)

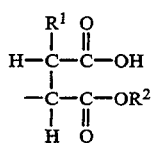

(I)

wherein $R^1$ stands for a hydrogen atom, a halogen atom or an alkyl group having 1 to 3 carbon atoms and $R^2$ stands for an alkyl group having 1 to 10 carbon atoms, a cycloalkyl group or an aryl group. If $R^1$ is an alkyl group having four or more carbon atoms, or if $R^2$ is an alkyl group having 11 or more carbon atoms, production becomes difficult. The content of the group represented by the formula (I) may usually be 0.05 to 0.7 mol and preferably 0.1 to 0.5 mol per 100 g of the polymer compound (A).

There is no limitation to the method of introducing the group represented by the formula (I) into the polymer compound (A). Preferred, however, is a method consisting in addition reaction to the polymer compound (A) of a dicarboxylic acid represented by formula (II -1)

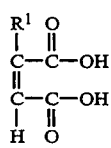

(II-1)

wherein $R^1$ has the same meaning as $R^1$ of the formula I, or a dicarboxylic anhydride represented by the formula (II -2)

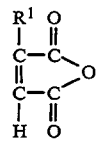

(II-2)

wherein $R^1$ has the same meaning as $R^1$ of the above formula (I), followed by half esterification. The dicarboxylic acids represented by the formula (II -1) preferably include maleic acid or citraconic acid, whereas the dicarboxylic anhydrides represented by the formula (II -2) preferably include maleic anhydride and citraconic anhydride.

The addition reaction to the polymer compound (A) of dicarboxylic acid represented by the formula (II -1) or dicarboxylic anhydride represented by the formula (II -2) may be usually carried out by mixing these ingredients at a temperature ranging between 100° and 300° C., in accordance with, for example, a method described in Japanese Patent Publication No. 46-11195 (1971). During the reaction of addition, phenylene diamines, pyrogallols or naphthols may be present in the system to prevent gellation. If two or more different polymer compounds (A) are used, addition reaction may be carried out for each of the polymer compounds for subsequent mixing, or the polymer compounds (A) may be mixed prior to the reaction of addition. For half esterification of the resulting addition reaction product, the latter may be reacted with a hydroxyl group-containing compound (B), such as alcohols having 1 to 18 carbon atoms, e.g. methanol, ethanol, propanol, butanol or benzyl alcohol, or cellosolves, such as methyl cellosolve, ethyl cellosolve, butyl cellosolve or phenyl cellosolve. The reaction of half esterification may be carried out usually at 0° to 300° C. and preferably at 50° to 200° C., and may be carried out above all at a temperature lower than the boiling point of the hydroxyl group-containing compound (B).

The addition reaction and the reaction of half esterification may be carried out using a solvent or a catalyst. Although there is no limitation to the solvents employed, unless they affect the reaction adversely, it is preferred to use the hydroxyl group-containing compound (B) as a solvent.

The usable catalysts may include tertiary amines, such as, for example, triethylamine, trimethylamine, dimethylaminoethanol, triethanol amine or dibutylbenzylamine.

For preventing tack of a coating film before and after light irradiation, an imide group-containing unit represented by the formula (III)

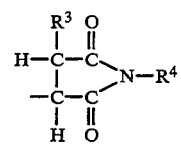

(III)

wherein $R^3$ stands for a hydrogen atom, a halogen atom or an alkyl group having 1 to 3 carbon atoms, $R^4$ stands for an alkyl group having 1 to 10 carbon atoms, a cycloalkyl group or an aryl group, may be contained in the polymer compound (A).

Although there is no limitation to the method of introducing the imido group-containing units, an amount of an amine compound as required may be introduced into a reaction system of half estrification for simultaneous reaction with half esterification. Any amine compound may be employed provided that it is a primary amine compound. Most preferred are amine compounds having aromatic rings and capable of lowering tack of the coating film before and after light irradiation, such as aniline, benzylamine, 4-methylbenzylamine, m-methoxybenzylamine, 1-aminoindene or 1-naphthalenemethylamine. The amine compounds may be reacted usually at a temperature of 0° to 300° C. and preferably at a temperature of 50° to 200° C. The amount of the amine compounds may usually be 0 to 60 mol percent and preferably 10 to 50 mol percent with respect to dicarboxylic acid of the formula (II -1) or dicarboxylic anhydride of the formula (II -2) addition reacted with the compound (A). The amount of the amine compound exceeding 60 mol percent is not desirable because the light irradiated area becomes difficultly soluble during development while cracking tends to occur in the protective film.

As a compound having a quinone diazide unit, which is the component (b) of the positive type photoresist composition of the present invention, a compound having at least one structural unit selected from the formulas (IV -1), (IV -2) and (IV -3)

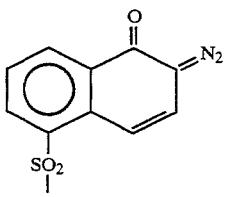
(IV-1)

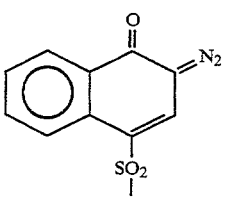
(IV-2)

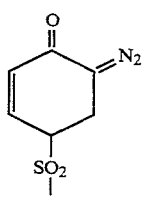
(IV-3)

and mixtures thereof, is most preferred.

Among the compounds having the quinone diazide units represented by the formulas (IV -1) to (IV -3) are esterification products (C) of trihydroxybenzophenones, such as, for example, 2,3,4-trihydroxybenzophenone or 2,3,6-trihydroxybenzophenone or tetrahydroxybenzophenones such as 2,3,4,5-tetrahydroxybenzophenone or 2,3,4,4'-tetrahydroxybenzophenone, with one or more quinone diazides selected from the following formulas (V -1), (V -2) and (V -3):

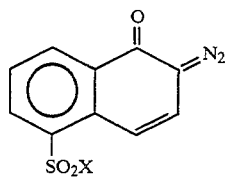
(V-1)

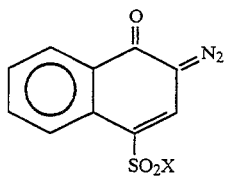
(V-2)

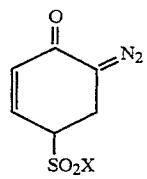
(V-3)

wherein X stands for a hydrogen atom or a halogen atom, such as a chlorine, fluorine, bromine or iodine atom. The esterification products (C) may be produced for example by the method described in Japanese Laid-Open Patent Application Nos. 59-172455 or 64-90250 and, more specifically, by condensation reaction of usually 1 to 4 mols and preferably 1.5 to 3.7 mols of the quinone diazide compound represented by the formula (V -1), (V -2) or (V -3) with 1 mole of the above mentioned trihydroxybenzophenones or tetrahydroxybenzophenones in the presence of an amine.

Among other components (b) is a compound (D) which is the above mentioned polymer compound (A), into at least a portion of the double bonds of which compound is introduced a group represented by the formula (IV)

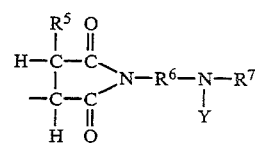
(VI)

wherein $R^5$ stands for a hydrogen atom, a halogen atom or an alkyl group having 1 to 3 carbon atoms, $R^6$ stands for a bivalent hydrocarbon residue having 1 to 10 carbon atoms, $R^7$ stands for an alkyl group having 1 to 10 carbon atoms, a cycloalkyl group or an aryl group and Y stands for a quinone diazide unit represented by the formula (IV -1), (IV -2) or (IV -3). Thus, the compound (D) is a compound which is the above mentioned polymer compound (A) into which the group represented by the formula (VI) has been introduced. The polymer compound (A) employed in the compound (D) may be the same as or different from the compound (A) employed as the component (a). The compound (D) may be produced by introducing an imide group-containing unit represented by the formula (VII)

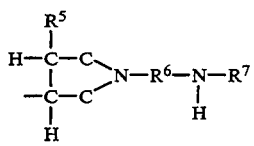

wherein $R^5$, $R^6$ and $R^7$ have the same meanings as in formula (VI), into the polymer compound (A), and by linking the quinone diazide unit Y of formula (VI) to the resulting compound. For introducing the imido group-containing unit of the formula (VII) into the polymer compound (A), the polymer compound (A) is reacted by addition reaction with dicarboxylic acid having the formula (II -1) or with dicarboxylic anhydride having the formula (II -2), and the resulting compound is reacted with a diamine compound represented by the formula (VIII)

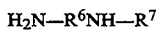

wherein $R^6$ and $R^7$ have the same meaning as in formula (VI), such as, for example, N-methylethylenediamine, N-ethylethylenediamine or N-(2-hydroxyethyl)ethylenediamine. It is noted that dicarboxylic acid having the formula (II -1) or dicarboxylic anhydride having the formula (II -2) may be the same as or different from the compound employed as the component (a), and that the addition reaction may be carried out similarly to the addition reaction to the polymer compound (A) of dicarboxylic acid having the formula (II -1) or of dicarboxylic anhydride having the formula (II -2). The reaction of introducing the imide group-containing unit represented by the formula (VII) into the polymer compound (A) by reaction of the diamine compound represented by the formula (VIII) may usually be carried out at a temperature of 50° to 300° C. and preferably at 100° to 200° C.

As the reaction of introducing the imide group-containing unit represented by the formula (VII) into the polymer compound (A), a method consisting in carrying out the above mentioned addition reaction addition followed by the reaction with the hydroxyl group-containing compound (B) to yield a half ester group, and the reaction with the diamine compound represented by the formula (VIII), in this order, is most preferred. For lowering the viscosity of the reaction system and facilitating product handling as well as preventing gellation and facilitating dispersion or solubilization in water in the course of production of the positive type electrodeposition photoresist with the use of the resulting composition, it is preferred that the hydroxyl group-containing compound (B) be used in a mol number in excess of the mol number of acid groups in the compound produced by the addition reaction, and that the compound (B) be used simultaneously as a solvent.

The imide group-containing unit of the formula (VII) thus produced is reacted with the quinone diazide compound of the formula (II -1), (II -2) or (II -3) to produce the compound (D) which is the polymer compound (A) into which the group of the formula (VI) has been introduced. The reaction may be carried out in the presence of an inert organic solvent capable of mixing the imide group-containing unit having the formula (VII) and the quinone diazide compound, and a base, at a temperature usually of 10° to 80° C. and preferably of 20° to 60° C. for usually 10 minutes to 50 hours and preferably for 1 to 15 hours. The inert organic solvents may include, for example, dioxane, acetone, tetrahydrofuran, methylethylketone, methylisobutylketone, benzene, toluene and xylene, whereas the base may include, for example, alkali metal salts, such as sodium carbonate, sodium hydroxide, potassium hydroxide or potassium carbonate, amines such as triethylamine, triethanolamine, tributylamine, dimethylbenzylamine or pyridine, solid bases such as magnesium oxide or aluminum oxide, and cationic exchange resins.

The esterification product (C) and the compound (D), that may be used as the aforementioned component (b), may be used alone or in combination.

With the positive type photoresist composition according to the present invention, the proportion of the component (b) to the component (a) is 25 to 100 parts by weight and preferably 35 to 80 parts by weight to 100 parts by weight of the component (a). If the amount of the component (b) is less than 25 parts by weight, the amount of carboxylic acid generated in the irradiated area is so small that difficulties are raised in connection with development with a weakly alkaline developing solution. On the other hand, if the amount exceeds 100 parts by weight, cracking etc. may be produced in the coating film.

The positive type photoresist composition of the present invention may be prepared by mixing and agitating the components (a) and (b) in the presence of, for example, an organic solvent. The organic solvent may be preferably enumerated by ethyl cellosolve, propyl cellosolve, butyl cellosolve, ethyleneglycol dimethylether, diethyleneglycol dimethylether, diacetone alcohol and methylethylketone. These solvents may be used alone or as a mixture.

In using the positive type photoresist composition of the present invention, it may be coated on a metal layer on the board. The coating methods may include spray coating, dip coating or coating with a spinner of the positive type photoresist which has been dissolved in e.g. a solvent. These methods are suited for preparing an integrated circuit because it becomes possible with these methods to produce a resist which is thin in film thickness and which is superior in sensitivity and adhesiveness to a board or substrate.

The positive type photoresist composition according to the present invention may be neutralized and dispersed or dissolved in water and coated in this state on a metal layer by dip coating or electrodeposition coating.

Although there is no limitation to the methods of neutralization, a method is usually employed which consists in adding an organic amine, such as trimethylamine, triethylamine or dimethylethanolamine to the positive type photoresist composition in an amount preferably of 0.2 to 1.0 molar equivalent with respect to the carboxylic group in the composition. There is no limitation to the neutralization temperature which may usually be 0° to 120° C. and preferably in the vicinity of room temperature.

For facilitating dispersion or solubilization of the composition by neutralization and improving stability of the aqueous solution or dispersion, organic solvents soluble in water and capable of dissolving various resin compositions may also be used for neitralization. These organic solvents may be those used for preparing the positive type photoresist composition. The amount of the organic solvent may preferably be of the order of 10 to 100 parts by weight to 100 parts by weight of the positive type photoresist composition.

In using the positive type photoresist composition thus dispersed or dissolved in water, if the composition is to be applied by electrodeposition as an electrodeposition bath, a board or substrate having its entire surface inclusive of through-holes coated with an electro-conductive metal layer is dipped as an anode in the electrodeposition bath and direct current is caused to flow therethrough for applying the positive type photoresist composition on the board. The film thickness of the positive type photoresist composition may be easily controlled to an occasionally optimum thickness as a function of the liquid temperature, current conduction time or current density. As a typical example of the conditions of electrodeposition for producing a standard film thickness of 5 to 20 μm, the liquid temperature, current conduction time and current density may be 25° C., 2 to 4 minutes and 0.4 to 0.8 mA/cm$^2$ (constant current), respectively.

Since the positive type photoresist composition of the present invention forms a protective film on a non-irradiated area of a board, the metal layer on the inner wall of the through-hole may be protected against an etching liquid. In addition, since the light irradiation may be made with the photomask in tight contact with the coating layer before and after light irradiation, a fine circuit pattern may be produced, while adhesiveness with the substrate or board may be improved.

On the other hand, if the positive type photoresist is dispersed or dissolved in water so as to be used as an electrodeposition bath, the liquid may be maintained in a stable state for a prolonged time.

EXAMPLES OF THE INVENTION

The present invention will be explained with reference to illustrating Examples. It is to be noted, however, that these Examples are not intended for limiting the scope of the invention.

SYNTHESIS EXAMPLE 1

1000 g of polybutadiene having a number average molecular weight of 1000, an iodine value of 430 and an amount of 1–2 bonds of 65 percent, manufactured and sold under the trade name of "B-1000" by NIPPON PETROCHEMICALS CO., LTD., 751 g of maleic anhydride, 5.0 g of a gellation inhibitor, manufactured and sold under the trade name of "ANTIGEN 6C" by SUMITOMO CHEMICAL CO., LTD. and 10 g of xylene, were charged into a separable flask of 3 lit. capacity, fitted with a reflux cooling tube and a nitrogen blowing tube, and reacted at 190° C. for 5 hours under a flow of a nitrogen gas. Unreacted maleic anhydride and xylene were then distilled off to give a maleinated polybutadiene.

The total acid value of the produced maleinated polybutadiene was measured and found to be 480 mgKOH/g.

SYNTHESIS EXAMPLE 2

1000 g of polybutadiene, manufactured and sold under the tradename of "B-1000" by NIPPON PETROCHENICALS CO., LTD., 388 g of maleic anhydride, 5.0 g of a gellation inhibitor, manufactured and sold under the trade name of "ANTIGEN 6C" by SUMITOMO CHEMICAL CO., LTD. and 10 g of xylene, were reacted in the same way as in Synthesis Example 1 to produce maleinated polybutadiene.

The total acid value of the produced maleinated polybutadiene was measured and found to be 320 mgKOH/g.

SYNTHESIS EXAMPLE 3

500 g of maleinated polybutadiene with the total acid value of 480 mgKOH/g, synthesized in Synthesis Example 1, 218 g of phenyl cellosolve and 205 g of diethyleneglycol dimethylether, were charged into a 2 lit. separable flask fitted with a reflux cooling tube, so as to be dissolved uniformly and reacted at 130° C. for three hours under a nitrogen gas stream. While the reaction mass was kept at 130° C., 61 g benzylamine were added thereto dropwise over 30 minutes. After termination of the dropwise addition, the reaction mass was heated to and maintained at 165° C. to continue the reaction for seven hours. A resin solution containing half-ester groups and imide groups was produced. The produced resin solution contained 80 wt. % of non-volatile components and 159 mg equivalent of carboxylic acid groups per 100 g of the solution.

SYNTHESIS EXAMPLE 4

500 g of maleinated polybutadiene with the total acid value of 320 mgKOH/g, prepared by the Synthesis Example 2, 197 g of phenyl cellosolve and 174 g of diethyleneglycol dimethyl ether, were charged into a 2 lit. separable flask fitted with a reflux cooling tube and dissolved uniformly. The reaction was continued under a stream of nitrogen gas at 130° C. for three hours to produce a resin solution containing half ester groups. The produced resin solution contained 80 wt. % of non-volatile components and 164 mg equivalent of carboxylic acid groups per 100 g of the solution.

SYNTHESIS EXAMPLE 5

500 g of maleinated polybutadiene with the total acid value of 320 mgKOH/g, synthesized by the Synthesis Example 2, and 300 g of phenyl cellosolve, were charged into a 2 lit. capacity separable flask fitted with a reflux cooling tube and a nitrogen blowing tube and dissolved uniformly so as to be reacted at 130° C. for three hours under a nitrogen stream. After the reaction mass was cooled to room temperature, 149 g of 2-(2-aminoethylamino) ethanol was added dropwise thereto over one hour. After termination of the dropwise addition, the reaction mass was heated to and kept at 125° C. to continue the reaction for four hours to yield an imide group-containing polyamine resin solution. The produced resin solution contained 67 wt. % of non-volatile components and 155 mg equivalent of amine groups per 100 g of the solution.

SYNTHESIS EXAMPLE 6

269 g of 1,2-naphthoquinonediazide sulfonyl chloride, 1900 g of dioxane and 300 g of Mg$_{4.5}$Al$_2$(OH)$_3$CO$_3$.mH$_2$O, m being 3 to 3.5, manufactured and sold under the trade name of "KYOWADO 1000" by KYOWA KAGAKU KOGYO KK, as a solid base, were charged into a 5 lit. separable flask fitted with a reflux cooling tube. To this reaction mixture maintained at 30° C., 645 g of the polyamine resin solution synthesized in the Synthesis Example 5 were added dropwise over two hours.

The reaction was continued for five hours while the reaction mass was maintained at 30° C. After termination of the reaction, the solid base was filtered off, 440 g of phenyl cellosolve were added and dioxane was removed by vacuum distillation to produce a photosensitive resin solution containing naphthoquinonediazide groups. The produced resin solution had 60 wt. % of non-volatile components and contained 150 mg equivalent of naphthoquinonediazide groups per 100 g of the solution.

EXAMPLE 1

75 g of the alkali-soluble resin solution synthesized in the Synthesis Example 3 and 67 g of the photosensitive resin solution synthesized in the Synthesis Example 6 were mixed and dissolved each other. To this mixture were added 6 g of triethylamine for neutralization and demineralized water was added to the neutralized mass until the solid content was 12% to produce an electrodeposition bath of the positive type photoresist composition.

A copper-lined laminated plate for a printed circuit having through-holes was dipped as an anode in the above mentioned electrodeposition bath. After d.c. voltage of 40 V was applied to the bath for three minutes, the laminated plate was washed with water and dried for five minutes at 100° C. to produce an electrodeposited film of the positive type photoresist composition having a film thickness of 7 $\mu$m. A positive pattern photomask was applied in vacuum to the film and irradiated with UV rays with a wavelength of 365 nm and a light exposure volume of 300 mJ/cm$^2$, using an ultra high voltage mercury lamp. The plate was dipped in a 1.5% aqueous solution of sodium metasilicate at 30° C. for 30 seconds for development. The line width of the protective layer produced was equal to the pattern line width while no pinholes or peeling or cracking of the protective layer were observed. After etching off copper with a ferric chloride solution, the plate was dipped in a 4% aqueous solution of sodium metasilicate at 40° C. for 60 seconds to remove the protective layer. In this manner, a circuit pattern of 30 $\mu$m line width without any defects was produced. It was seen that copper within the through-holes was protected from the etching solution and left in its entirety. After the electrodeposition bath was left at room temperature for three months, no resin components were precipitated, and no abnormalities were observed after repeated use.

EXAMPLE 2

75 g of the alkali-soluble resin solution synthesized in Synthesis Example 4 and 20 g of an ester of 2,3,4-trihydroxybenzophenone and 1,2-naphthoquinone diazide sulfonyl chloride, manufactured and sold under the trade name of "NT-260" by TOYO GOSEI CO., LTD. were dissolved in and mixed with 28 g of triethyleneglycol dimethylether. 6 g of triethylamine were added to the resulting mixture for neutralization sufficiently. Demineralized water was added to the neutralized mass until the solid content amounted to 12% to produce an electrodeposition bath of the positive type photoresist composition.

A copper-lined laminated plate for a printed circuit having through-holes was dipped as an anode in the above mentioned electrodeposition bath. After d.c. voltage of 40 V was applied to the bath for three minutes, the laminated plate was washed with water and dried over five minutes at 100° C. to produce an electrodeposited film of the positive type photoresist composition having a film thickness of 7 $\mu$m. A positive pattern photomask was applied in vacuum to the film and irradiated with UV rays with a wavelength of 365 nm and a light exposure volume of 300 mJ/cm$^2$, using an ultra high voltage mercury lamp. The plate was dipped in a 1.5% aqueous solution of sodium metasilicate at 30° C. for 30 seconds for development. The line of the protective layer produced was faithfull to the pattern line and no pinholes, peeling or cracking of the protective layer was observed. After etching off copper with a ferric chloride solution, the plate was dipped in a 4% aqueous solution of sodium metasilicate at 40° C. for 60 seconds to remove the protective layer. In this manner, a circuit pattern of 30 $\mu$m line width without any defects was produced. It was seen that copper within the through-holes was protected from the etching solution and left in .its entirety. After the electrodeposition bath was left at room temperature for three months, no resin components were precipitated, and no abnormalities were observed after repeated use.

EXAMPLE 3

75 g of the alkali-soluble resin solution synthesized in Synthesis Example 3 and 67 g the photosensitive resin solution synthesized in Synthesis Example 6 were mixed and dissolved each other. The resulting mixture was applied on a silicon oxide film wafer using a spinner and dried for five minutes at 100° C. to produce a coating film of a positive type photoresist composition having a film thickness of 2 $\mu$m.

A positive type photomask having a positive pattern was applied in vacuum to the film and irradiated with UV rays with a wavelength of 365 nm and a light exposure volume of 120 mJ/cm$^2$, using an ultra high voltage mercury lamp. The wafer was then dipped in a 0.5% aqueous solution of sodium metasilicate at 30° C. for 30 seconds for development. It was seen that a pattern protective layer with a line width of 1.0 $\mu$m was produced, while no pinholes or peeling or cracking of the protective layer was observed.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A positive photoresist composition comprising in admixture (a) 100 parts by weight of a resin which is a polymer compound (A) including carbon-carbon double bonds and having a molecular weight of 300 to 30,000 and an iodine value of 50 to 500, wherein, to at least a part of the double bonds of said polymer compound (A), a group represented by the formula (I) is present

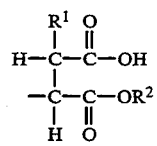

wherein R$^1$ denotes a hydrogen atom, a halogen atom or an alkyl group having 1 to 3 carbon atoms and R$^2$ denotes an alkyl group having 1 to 10 carbon atoms, a cycloalkyl group or an aryl group, a content of said group represented by the formula (I) being 0.05 to 0.7 mol per 100 g of said polymer compound (A) and (b) 25 to 100 parts by weight of a compound containing a quinone diazide unit; wherein an imide group represented by the formula (III)

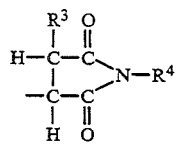

wherein R³ denotes a hydrogen atom, a halogen atom or an alkyl group having 1 to 3 carbon atoms and R⁴ denotes an alkyl group having 1 to 10 carbon atoms, a cycloalkyl group or an aryl group, is present into said polymer compound (A).

2. A composition as claimed in claim 1 wherein said polymer compound (A) is selected from the group consisting of natural lipids, stand oil, oligomers of conjugated diolefins, low polymerization degree copolymers of conjugated diolefins, low polymerization degree copolymers of conjugated diolefins with vinyl monomers having ethylenic unsaturated groups, and mixtures thereof.

3. A composition as claimed in claim 2 wherein said natural lipids are selected from the group consisting of linseed oil, tung oil, soybean oil, dehydrated caster oil and mixtures thereof.

4. A composition as claimed in claim 2 wherein said conjugated diolefins are selected from the group consisting of butadiene, isoprene, piperylene and mixtures thereof.

5. A composition as claimed in claim 2 wherein said vinyl monomer is selected from the group consisting of isobutylene, diisobutylene, styrene, α-methylstyrene, vinyl toluene, divinylbenzene, and mixtures thereof.

6. A composition as claimed in claim 1 wherein the group represented by the formula (I) is introduced into said polymer compound (A) by addition reaction of dicarboxylic acid represented by the formula (II -1)

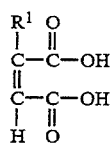

wherein R¹ denotes a hydrogen atom, a halogen atom or an alkyl group having 1 to 3 carbon atoms, to said polymer compound (A), followed by half esterification.

7. A composition as claimed in claim 6 wherein said dicarboxylic acid represented by the formula (II -1) is selected from the group consisting of maleic acid and citraconic acid.

8. A composition as claimed in claim 1 wherein the group represented by the formula (I) is introduced by addition reaction of dicarboxylic anhydride represented by the formula (II -2)

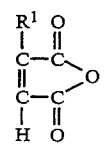

wherein R¹ denotes a hydrogen atom, a halogen atom or an alkyl group having 1 to 3 carbon atoms, into said polymer compound (A), followed by half esterification.

9. A composition as claimed in claim 8 wherein said dicarboxylic anhydride represented by the formula (II -2) is selected from the group consisting of maleic anhydride and citraconic anhydride.

10. A composition as claimed in claim 1 wherein, when said group represented by said formula (I) is introduced into said polymer compound (A), an amine compound is reacted simultaneously for introducing an imido group-containing unit represented by the formula (III)

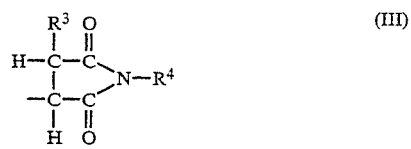

wherein R³ denotes a hydrogen atom, a halogen atom or an alkyl group having 1 to 3 carbon atoms and R⁴ denotes an alkyl group having 1 to 10 carbon atoms, a cycloalkyl group or an aryl group, into said polymer compound (A).

11. A composition as claimed in claim 10 wherein said amine compound is selected from the group consisting of aniline, benzylamine, 4-methylbenzylamine, m-methoxybenzylamine, 1-aminoindene, 1-naphthalene methylamine, and mixtures thereof.

12. A composition as claimed in claim 1 wherein said quinone diazide unit is selected from the group consisting of

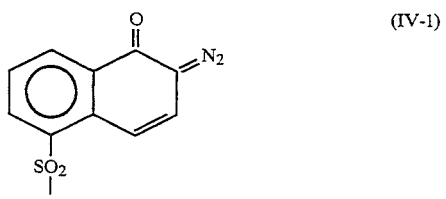

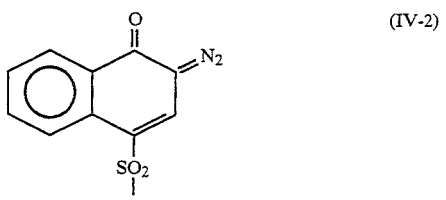

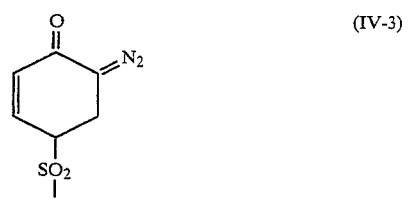

and mixtures thereof.

13. A composition as claimed in claim 1 wherein said compound containing the quinone diazide unit (b) is an esterification product of a compound selected from the group consisting of 2,3,4-trihydroxybenzophenone, 2,3,6-trihydroxybenzophenone, 2,3,4,5-tetrahydroxybenzophenone, 2,3,4,4'-tetrahydroxybenzophenone and mixtures thereof, with a compound selected from the group consisting of a compound having the formula

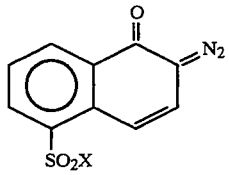

(V-1)

a compound having the formula

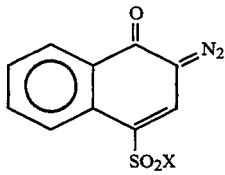

(V-2)

a compound having-the formula

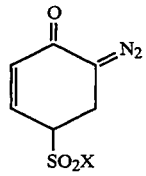

(V-3)

, and mixtures thereof, where X denotes a hydrogen atom, a chlorine atom, a fluorine atom, a bromine atom or an iodine atom.

14. A composition as claimed in claim 1 wherein said compound containing said quinone diazide unit (b) is a compound which is said polymer compound (A) to at least a part of the double bonds of which compound a group represented by the formula (VI)

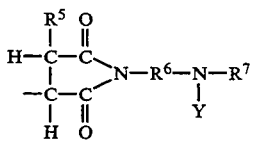

(VI)

wherein $R^5$ denotes a hydrogen atom, a halogen atom or an alkyl group having 1 to 3 carbon atoms, $R^6$ denotes a bivalent hydrocarbon residue having 1 to 10 carbon atoms, $R^7$ denotes and alkyl group having 1 to 10 carbon atoms, a cycloalkyl group or an aryl group and Y denotes a quinone diazide unit represented by the formulas

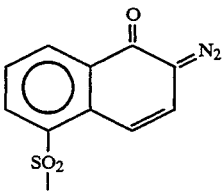

(IV-1)

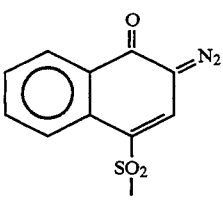

(IV-2)

or

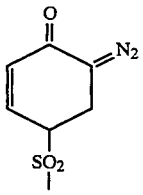

(IV-3)

is introduced.

15. A composition as claimed in claim 1 wherein said positive photoresist composition is neutralized and dispersed in water.

16. A composition as claimed in claim 15 wherein said positive photoresist composition is neutralized by addition of 0.2 to 1.0 molar equivalent of an organic amine selected from the group consisting of trimethylamine, triethylamine, dimethylethanolamine and mixtures thereof to carboxylic acid groups in said positive type photoresist composition.

17. A composition as claimed in claim 1 wherein said positive photoresist composition is neutralized and dissolved in water.

18. A composition as claimed in claim 17 wherein said positive photoresist composition is neutralized by addition of 0.2 to 1.0 molar equivalent of an organic amine selected from the group consisting of trimethylamine, triethylamine, dimethylethanolamine and mixtures thereof to carboxylic acid groups in said positive type photoresist composition.

* * * * *